United States Patent
Park et al.

(10) Patent No.: US 10,141,110 B2
(45) Date of Patent: Nov. 27, 2018

(54) MULTILAYER CERAMIC CAPACITOR AND BOARD HAVING THE SAME

(71) Applicant: SAMSUNG ELECTRO-MECHANICS CO., LTD., Suwon-si, Gyeonggi-do (KR)

(72) Inventors: Min Cheol Park, Suwon-si (KR); Young Ghyu Ahn, Suwon-si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 23 days.

(21) Appl. No.: 15/185,314

(22) Filed: Jun. 17, 2016

(65) Prior Publication Data

US 2017/0162322 A1    Jun. 8, 2017

(30) Foreign Application Priority Data

Dec. 4, 2015 (KR) .................. 10-2015-0172289

(51) Int. Cl.
*H01G 4/005* (2006.01)
*H05K 1/18* (2006.01)
(Continued)

(52) U.S. Cl.
CPC .......... *H01G 4/005* (2013.01); *H01G 4/1236* (2013.01); *H01G 4/248* (2013.01); *H01G 4/30* (2013.01);
(Continued)

(58) Field of Classification Search
CPC .................................................. H01G 4/005
(Continued)

(56) References Cited

U.S. PATENT DOCUMENTS

2007/0125195 A1* 6/2007 Akimoto .............. B22F 1/0074
                                                        75/252
2010/0039749 A1* 2/2010 Ritter ..................... H01G 4/005
                                                        361/301.4
(Continued)

FOREIGN PATENT DOCUMENTS

JP           10-97947 A      4/1998
KR       10-1141457 B1       5/2012

*Primary Examiner* — Hoa C Nguyen
*Assistant Examiner* — Stanley Tso
(74) *Attorney, Agent, or Firm* — McDermott Will & Emery LLP (57) ABSTRACT

A multilayer ceramic capacitor includes: a ceramic body in which a plurality of dielectric layers are stacked and first and second internal electrodes are alternately disposed with respective dielectric layers interposed therebetween; and first and second external electrodes formed on first and second surfaces of the ceramic body in a length direction, respectively. The first and second internal electrodes each include a body portion formed to be spaced apart from an edge of the dielectric layer and a lead portion extending from the body portion to be exposed to one surface of the ceramic body in the length direction and portions of the first and second surfaces of the ceramic body in the width direction, and first and second insulating layers are formed on the first and second surfaces of the ceramic body in the width direction, respectively, to insulate portions of the first and second lead portions not in contact with the first and second external electrodes, respectively.

20 Claims, 4 Drawing Sheets

(51) Int. Cl.
　　　*H01G 4/30*　　　(2006.01)
　　　*H01G 4/12*　　　(2006.01)
　　　*H01G 4/248*　　(2006.01)
　　　*H05K 1/11*　　　(2006.01)

(52) U.S. Cl.
　　　CPC .............. *H05K 1/111* (2013.01); *H05K 1/181* (2013.01); *H05K 2201/10015* (2013.01)

(58) Field of Classification Search
　　　USPC ........................................................ 174/260
　　　See application file for complete search history.

(56) References Cited

U.S. PATENT DOCUMENTS

| | | | |
|---|---|---|---|
| 2010/0243307 A1* | 9/2010 | McConnell ............ | H01G 4/232 174/260 |
| 2012/0147516 A1* | 6/2012 | Kim ....................... | H01G 4/232 361/301.4 |
| 2012/0268862 A1* | 10/2012 | Song .................... | H01G 4/0085 361/321.3 |
| 2014/0198427 A1* | 7/2014 | Kamobe ................ | H01G 4/30 361/301.4 |
| 2014/0268488 A1* | 9/2014 | Hattori .................. | H01G 4/30 361/301.4 |
| 2014/0285947 A1* | 9/2014 | Suga ..................... | H01G 4/232 361/301.4 |
| 2014/0345925 A1* | 11/2014 | Lee ........................ | H01G 4/30 174/260 |

* cited by examiner

FIG. 6 ized and had high capacitance implemented therein, an influence of an increase in ESL of the multilayer ceramic capacitor on reductions in performance of the electronic component relatively increases.

MULTILAYER CERAMIC CAPACITOR AND BOARD HAVING THE SAME

CROSS-REFERENCE TO RELATED APPLICATION

This application claims the benefit of priority to Korean Patent Application No. 10-2015-0172289, filed on Dec. 4, 2015 with the Korean Intellectual Property Office, the entirety of which is incorporated herein by reference.

BACKGROUND

The present disclosure relates to a multilayer ceramic capacitor (MLCC) and a board having the same.

In accordance with the recent trend toward miniaturization and increases in capacitance of electronic products, demand has increased for electronic components having a small size and high capacitance to be used in such electronic products.

Among such components, in the case of multilayer ceramic capacitors, when equivalent series inductance (hereinafter, referred to as "ESL") increases, performance of an electronic product may be deteriorated. In addition, as the electronic components have been miniaturized and had high capacitance implemented therein, an influence of an increase in ESL of the multilayer ceramic capacitor on reductions in performance of the electronic component relatively increases.

In this case, a quality coefficient associated with a relationship between inductance, capacitance, and resistance components of the capacitor is referred to as a quality (Q) factor.

Recently, in an electronic device such as a high performance smartphone, a multilayer ceramic capacitor having a high Q factor in a frequency region of several hundred MHz to several GHz should be used for communications. In this frequency region, a Q factor value is significantly affected by a resistance component of an electrode.

In order to increase the Q factor value, a method of stacking two layers of internal electrodes having the same polarity may be used.

However, it has been difficult to use this method to increase the Q factor value for all multilayer ceramic capacitors. For example, some multilayer ceramic capacitors have capacitance in a range in which it is difficult to use a double-layer internal electrode structure. Furthermore, only certain characteristics may be implemented by the double-layer internal electrode structure, among multilayer ceramic capacitors using C0G characteristics in which a capacitance change with respect to a temperature is low.

In addition, even in the case that the multilayer ceramic capacitor is formed by stacking two layers of internal electrodes having the same polarity as each other as described above, an effect of increasing the Q factor value is not large, as compared to an increase in the number of stacked layers due to a skin effect and a proximity effect, and there is a limitation in an amount of capacitance to be implemented, such that it may be difficult to apply this method to a small-sized multilayer ceramic capacitor.

Furthermore, after compression, at the time of manufacturing a product, there is a difference in degrees of density between a portion of the multilayer ceramic capacitor in which the internal electrode is printed and a portion thereof in which the internal electrode is not printed. Particularly, the difference is largest in an end portion of the internal electrode, which may increase the likelihood that cracks will occur due to a difference in shrinkage/expansion rates at the time of sintering the product. The thicker the internal electrode, or the larger the number of internal electrodes, the greater the difference in thickness, such that the probability that cracks will occur may be increased.

According to the method as described above, the internal electrodes having the same polarity as each other are adjacent to each other in a stacking direction, which may cause an increase in the occurrence rate of structural defects due to a difference in internal stress.

SUMMARY

An aspect of the present disclosure provides a multilayer ceramic capacitor (MLCC) capable of significantly improving low ESL characteristics by increasing a cross-sectional area of internal electrodes used as a current path, and having an excellent Q factor by decreasing a resistance loss of the internal electrodes, and aboard having the same.

According to an aspect of the present disclosure, a multilayer ceramic capacitor includes: a ceramic body in which a plurality of dielectric layers are stacked and first and second internal electrodes are alternately disposed with respective dielectric layers interposed therebetween; and first and second external electrodes formed on first and second surfaces of the ceramic body in a length direction, respectively. The first and second internal electrodes each include a body portion formed to be spaced apart from an edge of the dielectric layer and a lead portion extending from the body portion to be exposed to one surface of the ceramic body in the length direction and portions of the first and second surfaces of the ceramic body in the width direction, and first and second insulating layers are formed on the first and second surfaces of the ceramic body in the width direction, respectively, to insulate portions of the first and second lead portions not in contact with the first and second external electrodes, respectively.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present disclosure. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Terms with respect to directions of a hexahedron will be defined in order to clearly describe exemplary embodiments in the present disclosure. L, W and T illustrated in FIG. 1 refer to a length direction, a width direction, and a thickness direction, respectively. Here, the thickness direction may be the same as a stacking direction in which dielectric layers are stacked.

Multilayer Ceramic Capacitor

Figure 1:
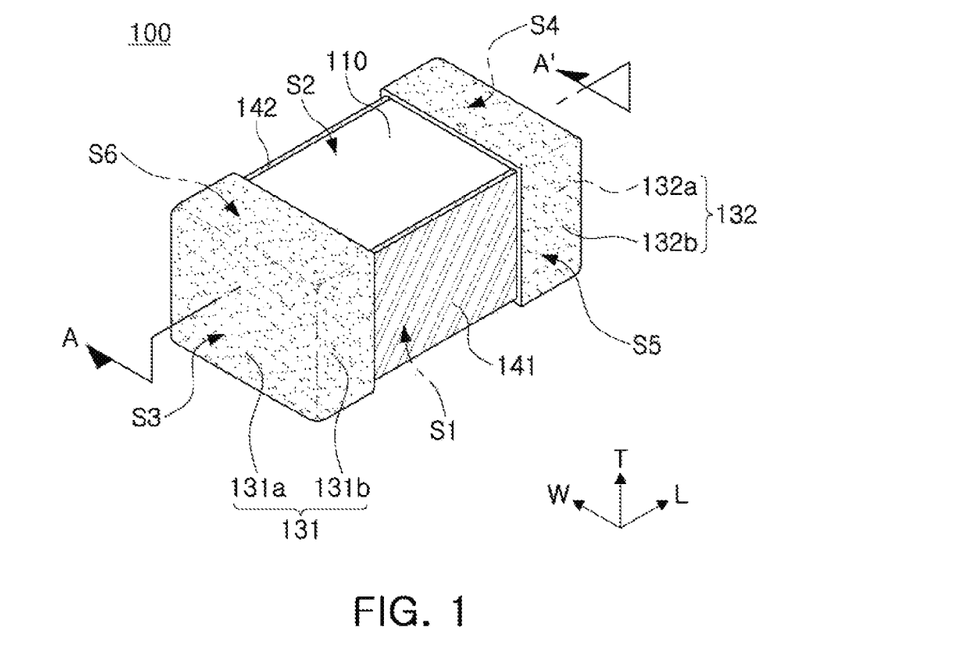
FIG. 1 is a perspective view schematically illustrating a multilayer ceramic capacitor (MLCC) according to an exemplary embodiment in the present disclosure.
Figure 2A:
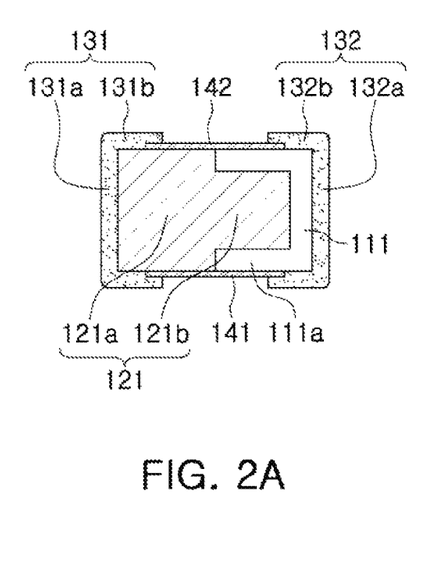
FIGS. 2A and 2B are plan views illustrating structures of first and second internal electrodes in the multilayer ceramic capacitor of FIG. 1, respectively.
Figure 2B:
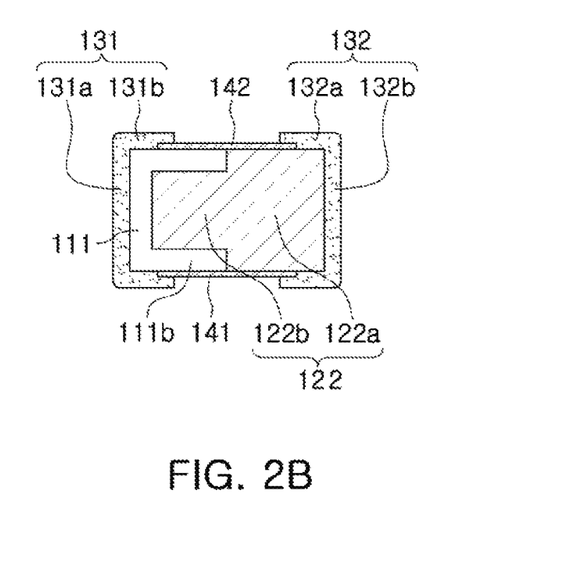
Figure 3:
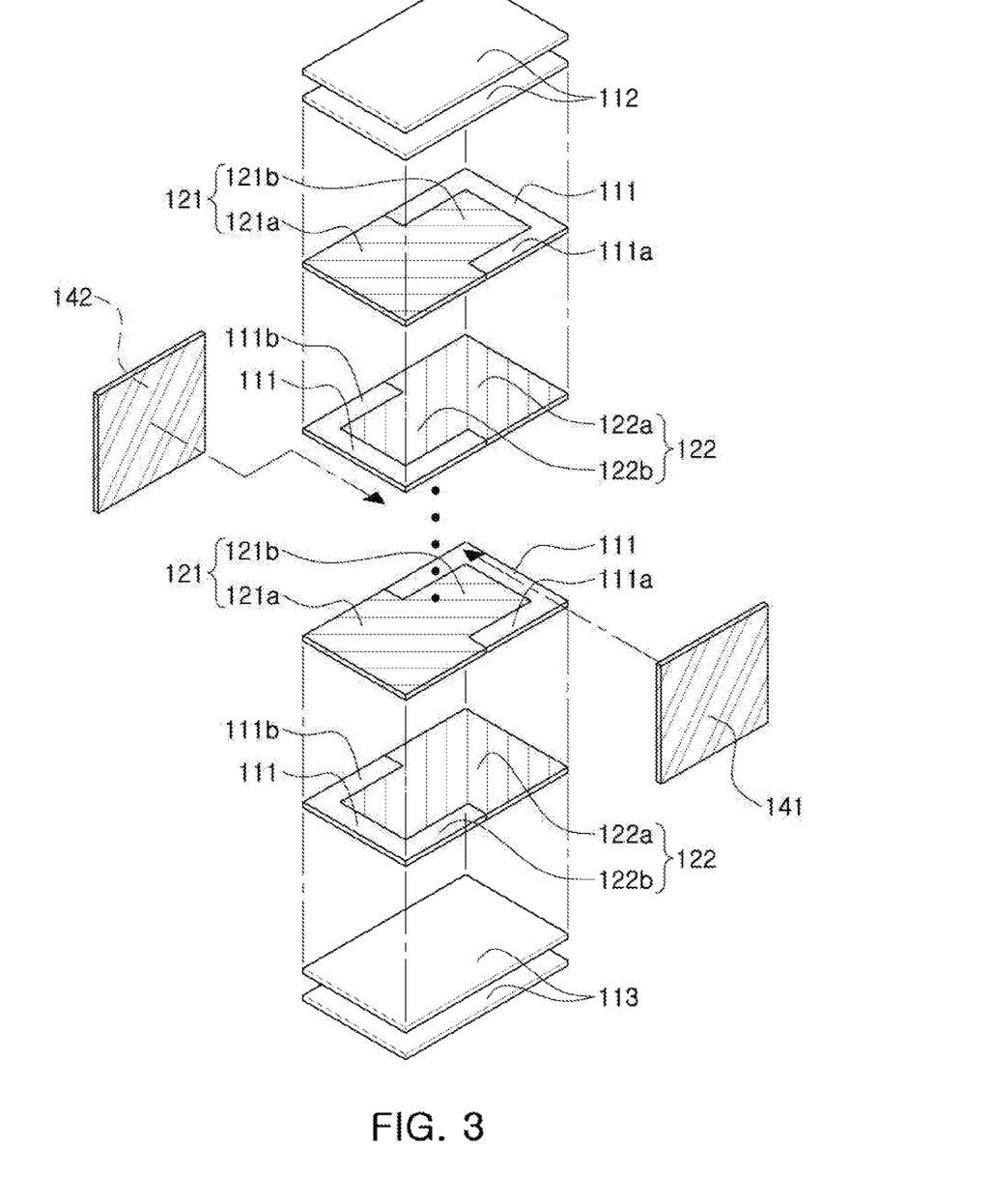
FIG. 3 is a separated perspective view schematically illustrating the multilayer ceramic capacitor of FIG. 1 except for external electrodes.
Figure 4:
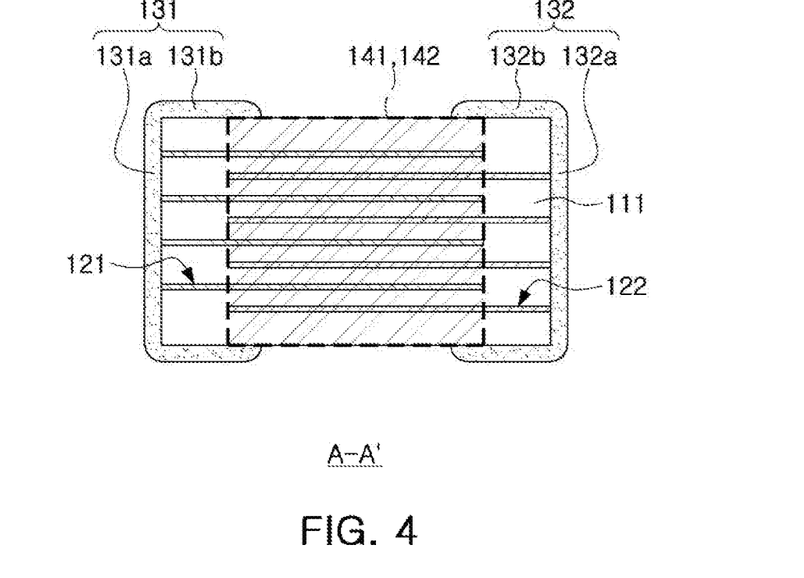
FIG. 4 is a cross-sectional view taken along line A-A' of FIG. 1.

FIG. 1 is a perspective view schematically illustrating a multilayer ceramic capacitor (MLCC) according to an exemplary embodiment in the present disclosure, FIGS. 2A and 2B are plan views illustrating structures of first and second internal electrodes in the multilayer ceramic capacitor of FIG. 1, respectively, FIG. 3 is a separated perspective view schematically illustrating the multilayer ceramic capacitor of FIG. 1 except for external electrodes, and FIG. 4 is a cross-sectional view taken along line A-A' of FIG. 1.

Referring to FIGS. 1 through 4, the multilayer ceramic capacitor 100 according to the exemplary embodiment in the present disclosure may include a ceramic body 110 in which a plurality of dielectric layers 111 are stacked and a plurality of first and second internal electrodes 121 and 122 are included, first and second external electrodes 131 and 132, and first and second insulating layers 141 and 142.

The ceramic body 110 may have first and second surfaces S1 and S2 opposing each other in the thickness direction, third and fourth surfaces S3 and S4 connecting the first and second surfaces S1 and S2 to each other and opposing each other in the length direction, and fifth and sixth surfaces S5 and S6 opposing each other in the width direction.

Hereinafter, in the present exemplary embodiment, a description will be provided on the assumption that amounting surface of the multilayer ceramic capacitor 100 is the first surface S1 of the ceramic body 110.

The ceramic body 110 as described above may be formed by stacking the plurality of dielectric layers 111 in the thickness direction and then sintering the stacked dielectric layers 111, and a shape thereof is not particularly limited, but may be a hexahedral shape as illustrated in the accompanying drawings.

The plurality of dielectric layers 111 configuring the ceramic body 110 may be in a sintered state, and adjacent dielectric layers 111 may be integrated with each other so that boundaries therebetween are not readily apparent without a scanning electron microscope (SEM).

In addition, the multilayer ceramic capacitor 100 according to the present exemplary embodiment may use C0G characteristics that a permittivity change with respect to a temperature change is small, and a dissipation factor (DF) of the ceramic may be significantly low (0.0001 to 0.0004).

Therefore, the dielectric layer 111 may be formed of a paraelectric material corresponding to an EIA Class 1 dielectric material of which relative permittivity is 100 or less may be used.

For example, the dielectric layer 111 may be formed of any one or a mixture of two or more selected from the group consisting of calcium zirconate ($CaZrO_3$)-based ceramic powder, barium zirconate ($BaZrO_3$)-based ceramic powder, and strontium zirconate ($SrZrO_3$)-based ceramic powder.

In addition, if necessary, the dielectric layer 111 may further contain a ceramic additive, an organic solvent, a plasticizer, a binder, a dispersant, and the like, in addition to the ceramic powder.

The ceramic body 110 as described above may include an active layer having a plurality of internal electrodes as apart contributing to forming capacitance of the capacitor and cover layers 112 and 113 disposed on and below the active layer as margin portions in the thickness direction, respectively.

The active layer may be formed by repeatedly stacking the plurality of first and second internal electrodes 121 and 122 with respective dielectric layers 111 interposed therebetween.

The cover layers 112 and 113 may have the same material and configuration as those of the dielectric layer 111 except that internal electrodes are not included therein.

The upper and lower cover layers 112 and 113 as described above may be formed by stacking one or two or more dielectric layers on an uppermost internal electrode of the active layer and below a lowermost internal electrode thereof, respectively, and may generally serve to prevent the first and second internal electrodes 121 and 122 from being damaged by physical or chemical stress.

The first external electrode 131 may include a first connection portion 131a formed on the third surface S3 of the ceramic body 110 in the length direction and a first band portion 131b extended from the first connection portion 131a to a portion of the first surface S1 of the ceramic body 110 and portions of the fifth and sixth surfaces S5 and S6 of the ceramic body 110 in the width direction, respectively.

The second external electrode 132, which is an electrode to which electricity having a different polarity from the first external electrode 131 is applied, may include a second connection portion 132a formed on the fourth surface S4 of the ceramic body 110 in the length direction and a second band portion 132b extended from the second connection portion 132a to a portion of the first surface S1 of the ceramic body 110 and portions of the fifth and sixth surfaces S5 and S6 of the ceramic body 110 in the width direction, respectively.

In this case, the first external electrode 131 may be formed so that the first band portion 131b is extended from the first connection portion 131a to a portion of the second surface S2 of the ceramic body 110, and the second external electrode 132 may be formed so that the second band portion 132b is extended from the second connection portion 132a to a portion of the second surface S2 of the ceramic body 110.

When the internal and external electrodes of the multilayer ceramic capacitor 100 are formed to have vertically symmetrical structures as described above, directionality of the capacitor may be removed.

Therefore, since any surface of the first and second surfaces S1 and S2 of the multilayer ceramic capacitor 100 may be provided as a mounting surface, at the time of mounting the multilayer ceramic capacitor 100 on a circuit board, there is no need to consider directionality of the mounting surface.

Furthermore, first and second plating layers (not illustrated) may be formed on the first and second external electrodes 131 and 132, respectively.

The first and second plating layers may include first and second nickel (Ni) plating layers respectively formed on the first and second external electrodes 131 and 132 and first and second tin (Sn) plating layers respectively formed on the first and second nickel plating layers.

The first and second internal electrodes 121 and 122, which are electrodes to which voltages having different polarities are applied, may be formed in the ceramic body 110 and alternately disposed to face each other with respective dielectric layers 111 interposed therebetween.

In this case, the first and second internal electrodes 121 and 122 may be electrically insulated from each other by the dielectric layer 111 disposed therebetween.

In addition, a material forming the first and second internal electrodes 121 and 122 is not particularly limited. For example, the first and second internal electrodes 121 and 122 may be formed using a conductive paste formed of at least one among a noble metal material such as palladium (Pd), a palladium-silver (Pd—Ag) alloy, or the like, nickel (Ni), and copper (Cu).

As a printing method of the conductive paste, a screen printing method, a gravure printing method, or the like, may be used, but the printing method is not limited thereto.

The first internal electrode 121 may include a first body portion 121b formed to be spaced apart from an edge of the dielectric layer 111 and a first lead portion 121a extended from the first body portion 121b to be exposed to the third surface S3 of the ceramic body 110 in the length direction and portions of the fifth and sixth surfaces S5 and S6 of the ceramic body 110 in the width direction.

In this case, the first external electrode 131 may be formed so that a length of portions of the first band portion 131b covering the fifth and sixth surfaces S5 and S6 of the ceramic body 110 is shorter than a length of exposed portions of the first lead portion 121a exposed to the fifth and sixth surfaces S5 and S6 of the ceramic body 110.

Therefore, the first lead portion 121a may have a structure in which an exposed portion thereof exposed to the third surface S3 of the ceramic body 110 comes into contact with the first connection portion 131a of the first external electrode 131 to thereby be electrically connected to each other, and portions of the exposed portions thereof exposed to the portions of the fifth and sixth surfaces S5 and S6 of the ceramic body 110 come into contact with the portions of the first band portion 131b of the first external electrode 131 formed on the fifth and sixth surfaces S5 and S6 of the ceramic body 110 to thereby be electrically connected to each other. Other portions of the exposed portions thereof are not covered by the first band portion 131b of the first external electrode 131 but are exposed to the fifth and sixth surfaces S5 and S6 of the ceramic body 110.

The second internal electrode 122 may include a second body portion 122b formed to be spaced apart from an edge of the dielectric layer 111 and a second lead portion 122a extended from the second body portion 122b to be exposed to the fourth surface S4 of the ceramic body 110 in the length direction and portions of the fifth and sixth surfaces S5 and S6 of the ceramic body 110 in the width direction.

In this case, the second external electrode 132 may be formed so that a length of portions of the second band portion 132b covering the fifth and sixth surfaces S5 and S6 of the ceramic body 110 is shorter than a length of exposed portions of the second lead portion 122a exposed to the fifth and sixth surfaces S5 and S6 of the ceramic body 110.

Therefore, the second lead portion 122a may have a structure in which an exposed portion thereof exposed to the fourth surface S4 of the ceramic body 110 comes into contact with the second connection portion 132a of the second external electrode 132 to thereby be electrically connected to each other, and the portions of the exposed portions thereof exposed to the portions of the fifth and sixth surfaces S5 and S6 of the ceramic body 110 come into contact with the portions of the second band portion 132b of the second external electrode 132 formed on the fifth and sixth surfaces S5 and S6 of the ceramic body 110 to thereby be electrically connected to each other. Other portions of the exposed portions thereof are not covered by the second band portion 132b of the second external electrode 132 but are exposed to the fifth and sixth surfaces S5 and S6 of the ceramic body 110.

Further, the length of the exposed portions of the first lead portion 121a exposed to the fifth and sixth surfaces S5 and S6 of the ceramic body 110 may be shorter than half of a length of the ceramic body 110.

In addition, the length of the exposed portions of the second lead portion 122a exposed to the fifth and sixth surfaces S5 and S6 of the ceramic body 110 may be shorter than half of the length of the ceramic body 110.

In a case in which the length of the exposed portion of the first or second lead portion 121a or 122a exposed to the fifth or sixth surface S5 or S6 of the ceramic body 110 is equal to or greater than half of the length of the ceramic body 110, the first and second lead portions 121a and 122a may partially overlap each other in the stacking direction, such that a short-circuit defect may occur in an overlapping portion between the first and second lead portions 121a and 122a at the time of cutting a multilayer body.

According to the present exemplary embodiment, since the first and second lead portions 121a and 122a are extended to be exposed to the fifth and sixth surfaces S5 and S6 of the ceramic body 110, an entire area of overlap between the first and second internal electrodes 121 and 122 may be increased, such that capacitance of the multilayer ceramic capacitor may be further increased.

In this case, the length of the exposed portion of the first or second lead portion 121a or 122a exposed to the fifth or sixth surface S5 or S6 of the ceramic body 110 may be equal to or less than 50% of the length of the ceramic body 110.

TABLE 1

| No. | Length of Exposed portion of Lead Portion/length of Ceramic body | Capacitance Increase Rate (%) | Q (@100 MHz) | ESL (pH) | Cutting Defect Rate (%) |
| --- | --- | --- | --- | --- | --- |
| 1 | 0 | 100 | 601 | 203 | 0 |
| 2 | 10% | 100 | 780 | 180 | 0 |
| 3 | 20% | 100 | 860 | 168 | 0 |
| 4 | 30% | 100 | 925 | 155 | 0 |
| 5 | 40% | 100 | 1037 | 152 | 0 |
| 6 | 50% | 102 | 1115 | 140 | 1 |
| 7 | 60% | 106 | 1186 | 138 | 11 |
| 8 | 70% | 109 | 1231 | 136 | 13 |
| 9 | 80% | 112 | 1230 | 135 | 17 |
| 10 | 90% | 114 | 1228 | 135 | 22 |

Referring to Table 1, it may be confirmed that when the length of the exposed portion of the first or second lead portion 121a or 122a exposed to the fifth or sixth surface S5 or S6 of the ceramic body 110 is greater than 50% of the length of the ceramic body 110, capacitance and the Q factor may be increased, and ESL may be continuously decreased, but at the time of cutting the multilayer body, defects may occur in the overlapping portion between the first and second lead portions 121a and 122a leading to short-circuits.

The first and second insulating layers 141 and 142 may be formed on the fifth and sixth surfaces S5 and S6 of the ceramic body 110, and serve to cover and insulate the portions of the first and second lead portions 121a and 122a not covered by the first and second band portions 131b and 132b of the first and second external electrodes 131 and 132 but are exposed to the fifth and sixth surfaces S5 and S6 of the ceramic body 110 as it is.

The first and second insulating layers 141 and 142 may be contain at least one of an epoxy and a ceramic material, but a material of the first and second insulating layers 141 and 142 is not limited thereto.

In this case, the first and second insulating layers 141 and 142 may be formed to have a length shorter than that of the ceramic body 110, and may be disposed to be spaced apart from the third and fourth surfaces S3 and S4 of the ceramic body 110 in the length direction.

Further, in the exposed portion of the first or second lead portion 121a or 122a exposed to the fifth or sixth surface S5 or S6 of the ceramic body 110, a portion that is not covered by the first or second band portion 131b or 132b may be larger than a portion covered by the first or second band portion 131b or 132b.

In this case, resistance losses of the first and second internal electrodes 121 and 122 may be decreased, respectively, such that a high Q factor value may be obtained in a high frequency band.

According to the present exemplary embodiment, the first and second external electrodes 131 and 132 may be formed so that the first and second band portions 131b and 132b formed on the portions of the fifth and sixth surfaces S5 and S6 of the ceramic body 110 in the width direction cover portions of both end portions of the first and second insulating layers 141 and 142 to overlap each other, respectively.

Therefore, the first and second insulating layers 141 and 142 may further improve an effect of preventing problems such as short-circuits between the lead portions, deterioration of moisture resistance or short-circuits due to external foreign objects.

In the multilayer ceramic capacitor according to the present exemplary embodiment, the lead portions of the internal electrodes may be exposed to three surfaces of the ceramic body, and the external electrodes may only come into contact with portions of the exposed portions of the internal electrodes exposed to the third and fourth surfaces of the ceramic body in the length direction and the fifth and sixth surfaces thereof in the width direction to thereby be connected thereto, respectively, such that low ELS characteristics may be significantly improved and the Q factor value may be increased by increasing a cross-sectional area of a current path of the internal electrode in which a current flows. At the same time, however, a defect occurrence rate of an internal structure may be increased.

Experimental Example

Multilayer ceramic capacitors according to Inventive Examples and Comparative Examples of the present disclosure were manufactured as follows.

First, slurry containing powder such as calcium zirconate ($CaZrO_3$), or the like, was applied to a carrier film and dried thereon, thereby preparing a plurality of ceramic green sheets having a thickness of 20 μm.

Then, a conductive paste for a nickel internal electrode was applied to the ceramic green sheets using a screen, thereby forming first and second internal electrodes 121 and 122 to be exposed to opposite surfaces of the ceramic green sheet in a length direction, respectively.

In this case, in the Inventive Example, the internal electrode was formed to include a body portion formed to be spaced apart from an edge of the ceramic green sheet and a lead portion extended from the body portion to one surface of the ceramic green sheet in the length direction and portions of both surfaces of the ceramic green sheet in a width direction, adjacent to one surface thereof in the length direction.

Next, about 15 ceramic green sheets were stacked, but ceramic green sheets on which the first and second internal electrodes were not formed were further stacked on and below the stacked ceramic green sheets, thereby manufacturing a multilayer body. Thereafter, the isostatic pressing was performed on the multilayer body at about 85° C. and a pressure of 1,000 kgf/cm$^2$.

Then, a ceramic multilayer body subjected to the isostatic pressing was cut into an individual chip form, and the debinding was performed on the cut chip by keeping the cut ceramic multilayer body at about 230° C. for 60 hours under an air atmosphere.

Thereafter, the ceramic multilayer body was sintered at about 1200° C. under a reduction atmosphere having oxygen partial pressure of $10^{-11}$ atm to $10^{-10}$ atm lower than Ni/NiO equilibrium oxygen partial pressure so that the internal electrode was not oxidized, thereby preparing a ceramic body.

In this case, the ceramic body was sintered to have a size of 0.6 mm×0.3 mm (length×width) after sintering. Here, a manufacturing tolerance was determined in a range of ±0.1 mm (length×width (L×W)).

Then, only in the Inventive Example, first and second insulating layers were formed on portions of fifth and sixth surfaces of the ceramic body to cover portions of exposed portions of the internal electrodes exposed to the fifth and sixth surfaces of the ceramic body.

Next, the first and second external electrodes were formed on both end portions of the ceramic body in the length direction to come into contact with exposed portions of the first and second internal electrodes, thereby completing the multilayer ceramic capacitors according to Inventive Example and Comparative Example, respectively. The multilayer ceramic capacitors were horizontally mounted on circuit boards, respectively.

Figure 6:
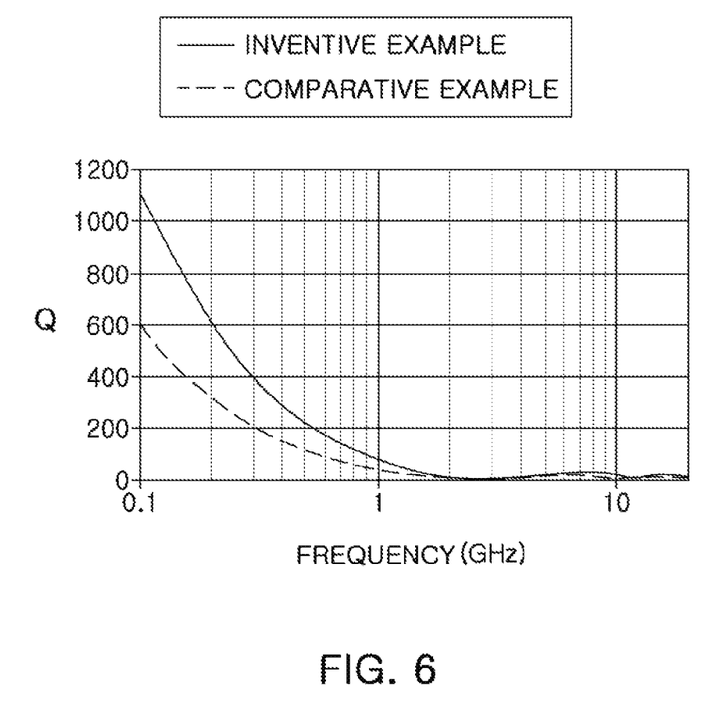
FIG. 6 is a graph illustrating a comparison result of changes in Q factor depending on a frequency in multilayer ceramic capacitors in the Inventive Example and the Comparative Example according to the present disclosure.

Thereafter, Q factor values of the multilayer ceramic capacitors in Inventive Example and Comparative Example depending on a frequency were measured, and the results were illustrated in graphs of FIG. 6.

In Inventive Example, the resistance component was low as compared to the Comparative Example, and thus, the Q factor value, which is a ratio of imaginary to real part of impedance, was high at a high frequency.

As shown in FIG. 6, in Comparative Example, the Q factor value was 601 at 100 MHz, and 46 at 1 GHz, but in Inventive Example, the Q factor value was 1115 at 100 MHz and 82 at 1 GHz.

Furthermore, in Inventive Example, in a case in which the multilayer ceramic capacitor was mounted on a circuit board so that the internal electrodes were disposed to be perpendicular to the circuit board, the Q factor value was decreased to 1100 at 100 MHz, and to 69 at 1 GHz.

Board Having Multilayer Ceramic Capacitor

Figure 5:
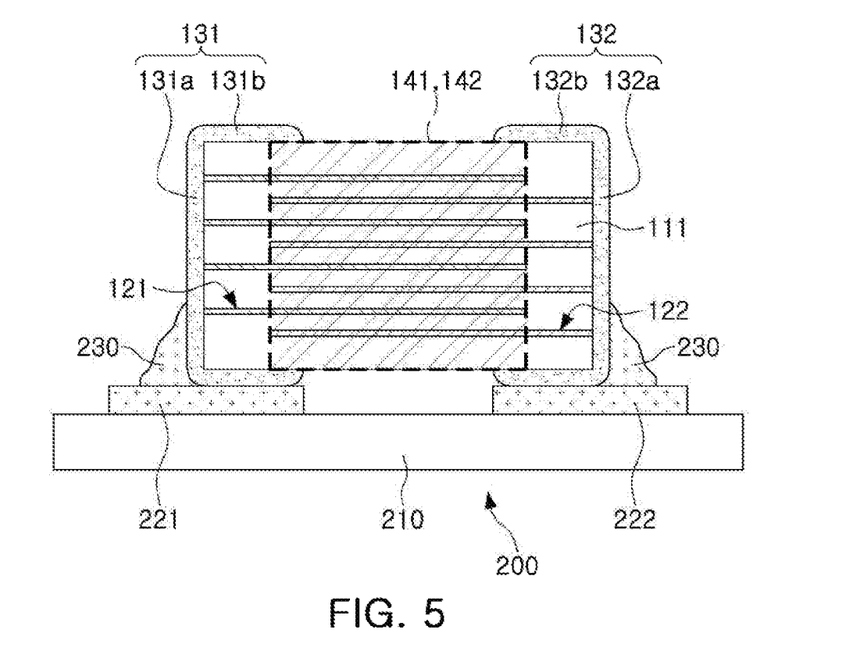
FIG. 5 is a cross-sectional view illustrating a board on which the multilayer ceramic capacitor of FIG. 1 is mounted on a circuit board.

FIG. 5 is a cross-sectional view illustrating a board on which the multilayer ceramic capacitor of FIG. 1 is mounted.

Referring to FIG. 5, a board 200 having a multilayer ceramic capacitor according to the present exemplary embodiment may include a circuit board 210 on which first and second external electrodes 131 and 132 of the multilayer ceramic capacitor 100 are horizontally mounted, and first and second electrode pads 221 and 222 formed on an upper surface of the circuit board 210 to be spaced apart from each other.

In this case, the multilayer ceramic capacitor 100 may be electrically connected to the circuit board 210 by solder 230 in a state in which the first and second external electrodes 131 and 132 are positioned to come into contact with the first and second electrode pads 221 and 222, respectively.

According to the present exemplary embodiment, internal electrodes of the multilayer ceramic capacitor 100 mounted on the circuit board 210 may be formed to be parallel to the circuit board 210, such that a higher Q factor value may be obtained in a high frequency region.

As set forth above, according to exemplary embodiments in the present disclosure, the low ESL characteristics may be significantly improved by increasing the cross-sectional area of the internal electrodes used as the current paths, and the Q factor of the multilayer ceramic capacitor may be improved by decreasing the resistance loss of the internal electrodes.

While exemplary embodiments have been shown and described above, it will be apparent to those skilled in the art that modifications and variations could be made without departing from the scope of the present invention as defined by the appended claims.

What is claimed is:

1. A multilayer ceramic capacitor comprising:
   a ceramic body in which a plurality of dielectric layers are stacked and first and second internal electrodes are alternately disposed with respective dielectric layers interposed therebetween; and
   first and second external electrodes disposed on first and second surfaces of the ceramic body opposite each other in a length direction, respectively, extending onto portions of a mounting surface of the ceramic body and portions of third and fourth surfaces of the ceramic body opposite each other in a width direction, respectively,
   wherein the first internal electrode includes a first body portion disposed to be spaced apart from an edge of the dielectric layer in the length direction and first and second edges of the dielectric layer in the width direction and a first lead portion extending from the first body portion to be exposed to the first surface of the ceramic body in the length direction and portions of the third and fourth surfaces of the ceramic body in the width direction,
   the second internal electrode includes a second body portion disposed to be spaced apart from the edge of the dielectric layer in the length direction and the first and second edges of the dielectric layer in the width direction and a second lead portion extending from the second body portion to be exposed to the second surface of the ceramic body in the length direction and portions of the third and fourth surfaces of the ceramic body in the width direction, and
   first and second insulating layers are disposed on the third and fourth surfaces of the ceramic body opposite each other in the width direction, respectively, and each has a length shorter than a length of the ceramic body such that the first and second lead portions each contact the first and second insulating layers and a respective one of the first and second external electrodes on the third and fourth surfaces of the ceramic body.

2. The multilayer ceramic capacitor of claim 1, wherein the dielectric layer uses C0G characteristics, and a dissipation factor (DF) of a ceramic ingredient is 0.0001 to 0.0004.

3. The multilayer ceramic capacitor of claim 2, wherein the dielectric layer is formed of a paraelectric material corresponding to an EIA Class 1 dielectric material of which relative permittivity is 100 or less.

4. The multilayer ceramic capacitor of claim 2, wherein the dielectric layer is formed of any one or a mixture of two or more selected from the group consisting of a calcium zirconate (CaZrO$_3$)-based ceramic powder, a barium zirconate (BaZrO$_3$)-based ceramic powder, and a strontium zirconate (SrZrO$_3$)-based ceramic powder.

5. The multilayer ceramic capacitor of claim 1, wherein a length of portions of the first and second external electrodes covering the third and fourth surfaces of the ceramic body opposite each other in the width direction is shorter than that of portions of the first and second lead portions exposed to the first and second surfaces of the ceramic body in the width direction.

6. The multilayer ceramic capacitor of claim 1, wherein portions of the first and second external electrodes covering the third and fourth surfaces of the ceramic body opposite each other in the width direction cover portions of first and second end portions, respectively, of the first and second insulating layers.

7. The multilayer ceramic capacitor of claim 1, wherein the first external electrode is disposed on portions of the first and second insulating layers that contact the first lead portion of the first internal electrode on the third and fourth surfaces of the ceramic body, and
the second external electrode is disposed on portions of the first and second insulating layers that contact the second lead portion of the second internal electrode on the third and fourth surfaces.

8. The multilayer ceramic capacitor of claim 1, wherein the first and second insulating layers are disposed to be spaced apart from the first and second surfaces of the ceramic body opposite each other in the length direction.

9. The multilayer ceramic capacitor of claim 1, wherein the first and second insulating layers contain at least one of an epoxy and a ceramic material.

10. The multilayer ceramic capacitor of claim 1, wherein the first and second external electrodes extend from the first and second surfaces of the ceramic body opposite each other in the length direction to portions of a surface of the ceramic body opposing the mounting surface of the ceramic body.

11. The multilayer ceramic capacitor of claim 1, wherein a length of portions of the first or second lead portion exposed to a surface of the ceramic body in the width direction is equal to or less than 50% of a length of the ceramic body.

12. The multilayer ceramic capacitor of claim 1, wherein the ceramic body further includes cover layers disposed on an uppermost internal electrode and below a lowermost internal electrode, respectively.

13. The multilayer ceramic capacitor of claim 1, wherein the first and second internal electrodes are disposed to be parallel to a mounting surface of the multilayer ceramic capacitor.

14. The multilayer ceramic capacitor of claim 1, wherein the first and second internal electrodes are disposed to be perpendicular to a mounting surface of the multilayer ceramic capacitor.

15. A board having a multilayer ceramic capacitor, the board comprising:
a circuit board having first and second electrode pads; and the multilayer ceramic capacitor of claim 1,
wherein the first and second external electrodes are mounted on the first and second electrode pads, respectively.

16. The multilayer ceramic capacitor of claim 1, further comprising a step disposed between the first body portion and the first lead portion, and a step between the second body portion and the second lead portion.

17. The multilayer ceramic capacitor of claim 1, wherein a length of the first lead portion is greater than a length of the first body portion, and a length of the second lead portion is greater than a length of the second body portion.

18. A multilayer ceramic capacitor comprising:
a ceramic body in which a plurality of dielectric layers are stacked and first and second internal electrodes are alternately disposed with respective dielectric layers interposed therebetween; and
first and second external electrodes disposed on first and second surfaces of the ceramic body opposite each other in a length direction, respectively, extending onto portions of a mounting surface of the ceramic body and portions of third and fourth surfaces of the ceramic body opposite each other in a width direction, respectively,
wherein the first internal electrode includes a first body portion disposed to be spaced apart from an edge of the dielectric layer and a first lead portion extending from the first body portion to be exposed to the first surface of the ceramic body in the length direction and portions of the third and fourth surfaces of the ceramic body opposite each other in the width direction, wherein a width of the first body portion is less than a width of the first lead portion,
the second internal electrode includes a second body portion disposed to be spaced apart from the edge of the dielectric layer and a second lead portion extending from the second body portion to be exposed to the second surface of the ceramic body in the length direction and portions of the third and fourth surfaces of the ceramic body opposite each other in the width direction, wherein a width of the second body portion is less than a width of the second lead portion, and
first and second insulating layers are disposed on the third and fourth surfaces of the ceramic body opposite each other in the width direction, respectively, and each has a length shorter than a length of the ceramic body such that the first and second lead portions each contact the first and second insulating layers and a respective one of the first and second external electrodes on the third and fourth surfaces of the ceramic body.

19. The multilayer ceramic capacitor of claim 18, further comprising a step disposed between the first body portion and the first lead portion, and a step between the second body portion and the second lead portion.

20. The multilayer ceramic capacitor of claim 18, wherein a length of the first lead portion is greater than a length of the first body portion, and a length of the second lead portion is greater than a length of the second body portion.

* * * * *